(12) United States Patent
Alcott et al.

(10) Patent No.: US 7,838,849 B2
(45) Date of Patent: Nov. 23, 2010

(54) ION IMPLANTERS

(75) Inventors: Gregory Robert Alcott, West Sussex (GB); Adrian Murrell, West Sussex (GB)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 11/976,429

(22) Filed: Oct. 24, 2007

(65) Prior Publication Data

US 2009/0108197 A1    Apr. 30, 2009

(51) Int. Cl.
*H01J 37/317* (2006.01)
*H01L 21/265* (2006.01)

(52) U.S. Cl. .............................. 250/492.21; 250/492.2; 250/396 R

(58) Field of Classification Search ............ 250/492.21, 250/492.2, 396 R
See application file for complete search history.

(56) References Cited

U.S. PATENT DOCUMENTS

| 4,560,879 | A | * | 12/1985 | Wu et al. | ................. | 250/492.2 |
| 4,587,432 | A | * | 5/1986 | Aitken | ..................... | 250/492.2 |
| 4,754,200 | A | | 6/1988 | Plumb et al. | | |
| 2007/0102652 | A1 | * | 5/2007 | Ring et al. | ............. | 250/492.21 |
| 2008/0164427 | A1 | * | 7/2008 | Collart et al. | .......... | 250/492.21 |
| 2009/0166565 | A1 | * | 7/2009 | Alcott et al. | .......... | 250/492.21 |

FOREIGN PATENT DOCUMENTS

JP          2007258154          10/2007

* cited by examiner

*Primary Examiner*—Nikita Wells
(74) *Attorney, Agent, or Firm*—Boult Wade Tennant

(57) ABSTRACT

The present invention relates to components in ion implanters having surfaces, such as graphite surfaces, adjacent to the path of the ion beam through the ion implanter. Such surfaces will be prone to sputtering, and sputtered material may become entrained in the ion beam. The present invention sees the use of surfaces that are formed so as to present a series of angled faces that meet at sharp intersections. In this way, any material will be sputtered away from the ion beam.

18 Claims, 7 Drawing Sheets

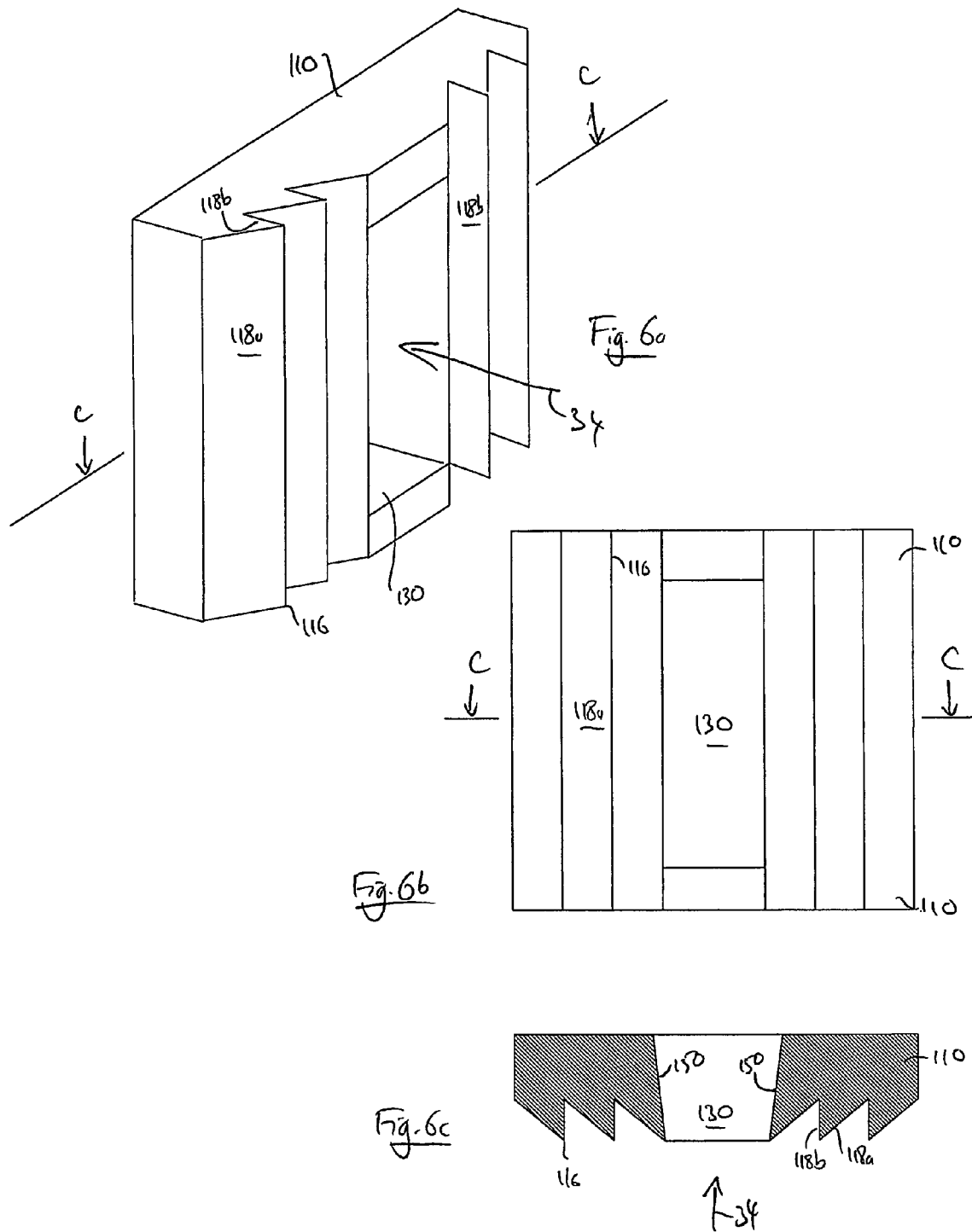

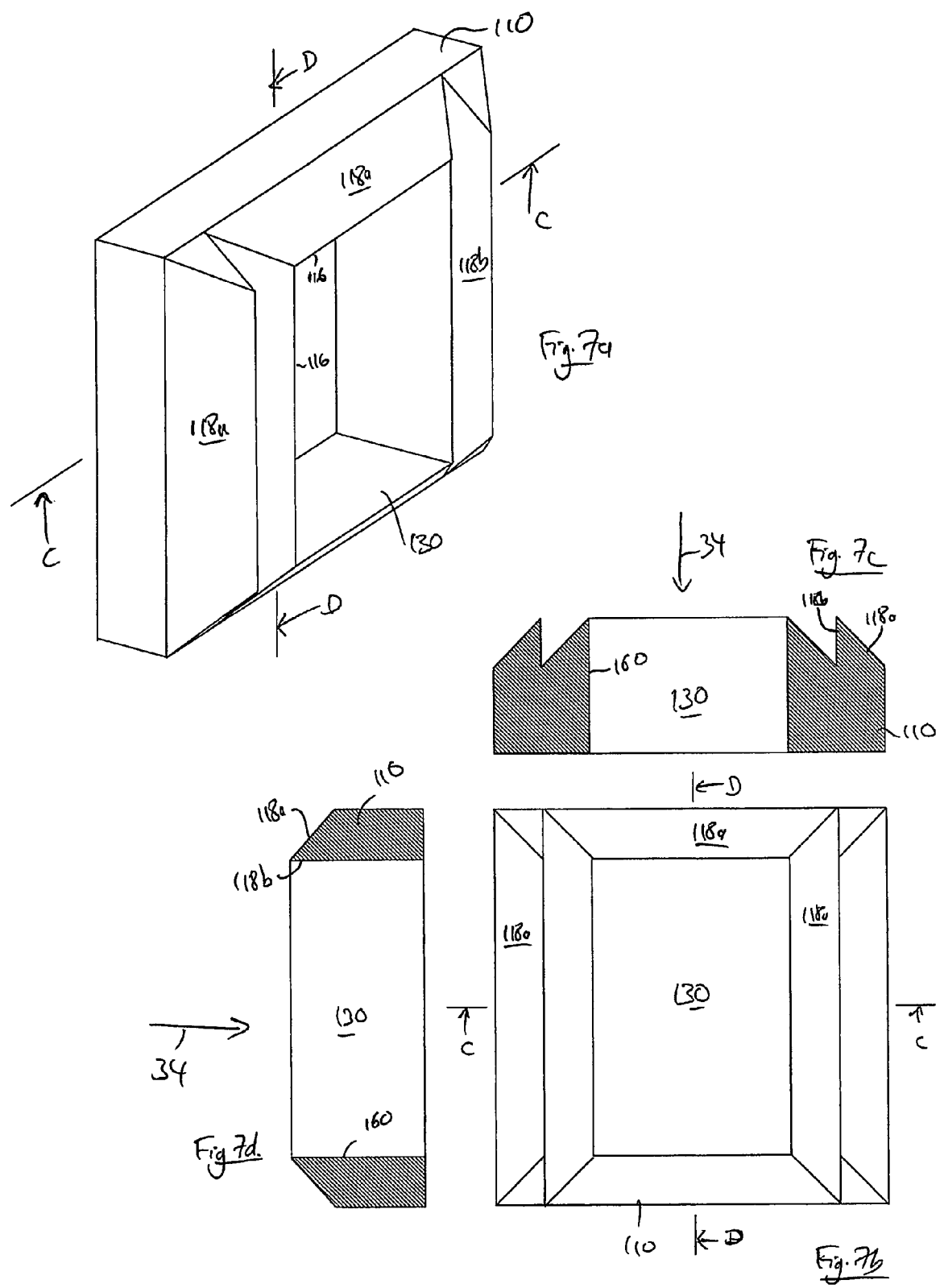

ION IMPLANTERS

FIELD OF THE INVENTION

The present invention relates to components in ion implanters having surfaces, such as graphite surfaces, adjacent to the path of the ion beam through the ion implanter. Such surfaces will be prone to sputtering, and sputtered material may become entrained in the ion beam. The present invention primarily addresses this problem of entrained material.

BACKGROUND OF THE INVENTION

Ion implanters are used in the manufacture of semi-conductor devices and other materials. In such ion implanters, semiconductor wafers or other substrates are modified by implanting atoms of a desired species into the body of the wafer, for example to form regions of varying conductivity.

Ion implanters are well known and generally conform to a common design as follows. An ion source generally comprises an arc chamber in which a hot plasma is generated. The plasma will contain ions of a desired species to be implanted.

An extraction lens assembly produces an electric field that extracts ions from the ion source and forms a mixed beam of ions. Only ions of a particular species are usually required for implantation in a wafer or other substrate, for example a particular dopant for implantation in a semi-conductor wafer. The required ions are selected from the mixed ion beam that emerges from the ion source by using a mass analysing magnet in association with a mass resulting slit. By setting appropriate operational parameters on the mass analysing magnet and the ion optics associated therewith, an ion beam containing almost exclusively the required ion species emerges from the mass resolving slit. The ions travel along a flight tube as they pass through the mass analysing magnet.

The ion beam is transported along a beam line to a process chamber where the ion beam is incident on a substrate held in place in the ion beam path by a substrate holder.

The various parts of the ion implanter are operated under the management of a controller, typically a suitably trained person, a programmed computer, or the like. A more detailed description of an ion implanter of this general type can be found in U.S. Pat. No. 4,754,200.

During normal operation of an ion implanter, unwanted material may become entrained in the ion beam. This material may strike the substrate, causing contamination or even damage to the devices being formed on the substrate. A major source of contaminants is material from ion implanter components that surround the ion beam path. If the ion beam strikes such components, material may be sputtered from that surface. As the surfaces surrounding the ion beam path are typically made from graphite, graphite is a major component in the material entrained in the ion beam.

Entrained material may be conveyed directly to the substrate to be implanted, or it may adhere to another surface in the ion implanter. Surfaces adjacent to the ion beam are most prone to receiving such deposits. As the amount of material deposited accumulates, the chances of the deposits delaminating to form flakes or particles increases. These flakes or particles frequently detach from their host surface and may become entrained in the ion beam. Consequently, the flakes or particles contain sputtered material that still ultimately reaches the substrate.

Our co-pending U.S. patent application Ser. No. 11/651, 107 and US Patent Application Publication No. 2007/0102652 address the problem of material depositing on downstream surfaces to form large flakes. The present invention is concerned with the initial sputtering of material and how to reduce the amount of material entrained in the ion beam.

SUMMARY OF THE INVENTION

Against this background, and from a first aspect, the present invention resides in an ion implanter component having a surface for defining, in use, at least in part an ion beam path through the ion implanter, wherein at least a portion of the surface is shaped so as to present a series of angled faces that meet at sharp intersections, thereby forming a substantially saw tooth cross section.

The angled faces act to cause sputtered material to be ejected at an angle. Preferably, the angled faces are arranged to face away from the ion beam path past the surface. Thus, in use, sputtered material is ejected away from the ion beam and so is less likely to become entrained in the ion beam. Some components are likely to benefit more from the provision of angled faces than others. For example, some components are regularly clipped by the ion beam.

The cross section need not form a perfect saw tooth. The angle of faces may differ, and each "face" of a side of a saw tooth may comprise two or more surfaces. The height of the saw teeth may also vary. FIGS. 4a to 4h show a non-exhaustive range of examples of cross sections falling within the scope of the present invention. Hence, whenever "substantially saw-tooth" appears herein, it should be construed in light of the above.

Optionally, the component defines the ion beam path there through and wherein portions of all surfaces immediately adjacent the ion beam path are shaped so as to present a series of angled faces that meet at sharp intersections, thereby forming a substantially saw tooth cross section, such that the angled faces are arranged to face away from the ion beam path through the component.

Preferably, the angled faces form a series of grooves. Preferably, the grooves extend generally in the direction of the ion beam path through the component. In this arrangement, the sides of the grooves are beneficially angled away from the direction of the ion beam path, such that most material is ejected away from the ion beam. Certain widths of the grooves have been found to particularly useful. For example, widths in the following ranges may be used: 10 mm to 100 mm, 10 mm to 50 mm, and 10 mm to 25 mm.

The present invention is particularly beneficial when used with graphite components. Such components may comprise a surface coating having a greater resistance to sputtering than graphite. This coating may be applied to just the surface defining at least in part the ion beam path, and/or a different portion of the component, or to all of the component. Preferably, the coating is tungsten or tantalum carbide.

From a second aspect, the present invention resides in an ion implanter component having a surface defining at least in part an ion beam path through the ion implanter, wherein at least a portion of the surface is shaped so as to present a series of faces that are angled away from the ion beam path, and wherein the series of faces meet at sharp intersections, thereby forming a substantially saw tooth cross section.

The series of faces may form a series of grooves extending generally in the direction of the ion beam path.

The component may be formed from graphite and, optionally, may comprise a surface coating having a greater resistance to sputtering than graphite. The coating may be applied to the surface having angled faces as well as other portions of the component. Preferably, the coating is tungsten or tantalum carbide.

Any of the above described components may be a flight tube, for example a flight tube in a mass analyser.

From a third aspect, the present invention resides in a mass analyser for an ion implanter comprising one or more parts having a surface that define a flight tube for the passage of ions through the mass analyser, wherein at least a part a surface defining the flight tube is shaped so as to present a series of faces that are angled away from the ion beam path, and wherein the series of faces meet at sharp intersections, thereby forming a substantially saw tooth cross section.

The series of faces may form a series of grooves extending generally in the direction of the ion beam path. Optionally, the grooves may have a width selected from the following ranges: 10 mm to 100 mm, 10 mm to 50 mm, and 10 mm to 25 mm.

The one or more parts may be formed from graphite. The one or more parts may comprise a surface coating having a greater resistance to sputtering than graphite, such as tungsten or tantalum carbide.

Optionally, the surface having the surface patterning is oriented to face up the flight tube in an upstream direction.

From a fourth aspect, the present invention resides in an ion implanter graphite component comprising a surface coating having a greater resistance to sputtering than graphite. Preferably, the coating is tungsten or tantalum carbide.

From a fifth aspect, the present invention resides in an ion implanter graphite component having a surface defining at least in part an ion beam path through the ion implanter, wherein at least a portion of the surface has a coating having a greater resistance to sputtering than graphite. Preferably, the coating is tungsten or tantalum carbide.

From a sixth aspect, the present invention resides in a mass analyser for an ion implanter comprising one or more parts having a surface that defines a flight tube for the passage of ions through the mass analyser, wherein at least a part a surface defining the flight tube has a coating having a greater resistance to sputtering than graphite. Preferably, the coating is tungsten or tantalum carbide.

The present invention also resides in an ion implanter including any of the components or mass analysers described above.

The components, mass analysers and ion implanters described above may comprise a further modification of the surface that defines the ion beam path and/or flight tube. One or more of the faces, including all of the faces, of the surface may have been roughened. Thus, an arrangement is achieved that has a larger-scale series of angled faces intended to direct sputtering of material away from the ion beam, and also a smaller scale roughening of the faces to create surface features that resist the deposition of material. As a result, both the initial deposition of material into large flakes is resisted, and entrainment of sputtered material into the ion beam is also resisted.

The faces may be roughened so as to provide a pattern of surface features, such as a regular pattern of surface features. Optionally, the faces may have been roughened to provide surface features defined at least in part by sharp changes in orientation of adjacent parts of the face, for example to provide surface features defined at least in part by adjacent faces that meet at a sharp edge.

The surface may have been roughened to provide a series of grooves. The grooves may have a depth in a range of 0.1 mm to 10 mm, 0.25 mm to 7.5 mm, or 0.5 mm to 5 mm. The faces may have been roughened to provide a series of side-by-side grooves, for example to have a regular spacing in a range of: 0.1 mm to 10 mm, 0.25 mm to 7.5 mm, or 0.5 mm to 5 mm. Consequently, the grooves on each individual face are on a smaller scale than the scale of the faces themselves. The grooves may have any of the following cross-sectional profiles: v-shape, u-shaped, saw tooth or box-like trenches.

Preferably, the faces have been roughened to provide at least two intersecting series of grooves. The first series and second series may be disposed orthogonally. The first and second series may comprise v-shaped grooves that intersect to form an array of tetrahedra.

BRIEF DESCRIPTION OF THE DRAWINGS

In order that the present invention may be better understood, a preferred embodiment will now be described with reference to the accompanying drawings, in which:

FIG. 6a is a perspective view of an apertured electrode according to an embodiment of the present invention;

FIG. 6b is a front view of the electrode of FIG. 6a;

FIG. 6c is a cross-section taken along line C-C of FIG. 6a;

FIG. 7a is a perspective view of another apertured electrode according to an embodiment of the present invention;

FIG. 7b is a front view of the electrode of FIG. 7a;

FIG. 7c is a cross-section taken along line C-C of FIG. 7a;

FIG. 7d is a cross-section taken along line D-D of FIG. 7a; and

DETAILED DESCRIPTION OF THE INVENTION

Figure 1:
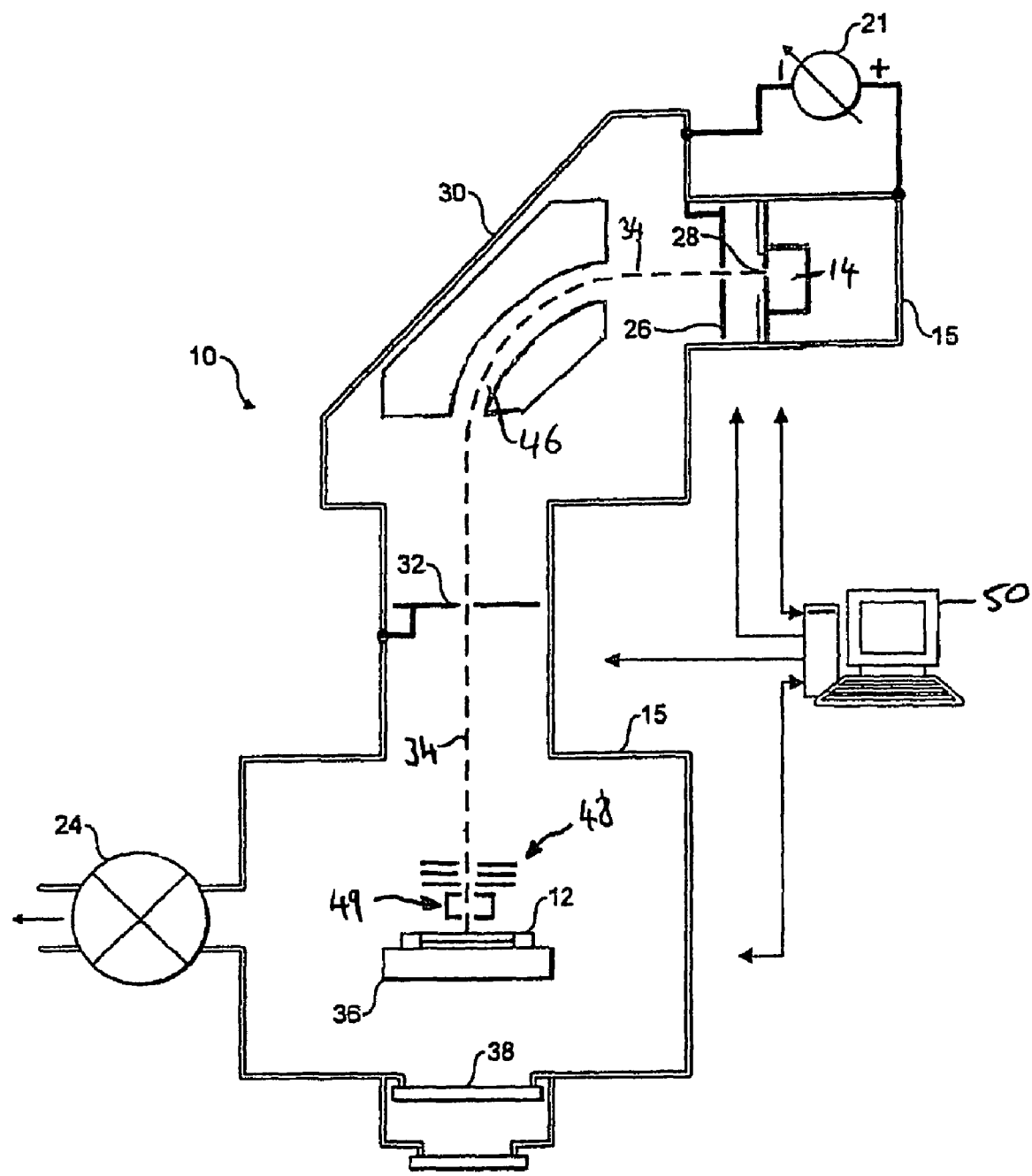
FIG. 1 is a schematic representation of an ion implanter.

In order to provide a context for the present invention, an exemplary application is shown in FIG. 1, although it will be appreciated this is merely an example of the application of the present invention and is in no way limiting.

FIG. 1 shows an ion implanter 10 for implanting ions in semiconductor wafers 12 that may be used in accordance with the present invention. The ion implanter 10 comprises a vacuum chamber 15 pumped through valve 24. Ions are generated by ion source 14 and are extracted by an extraction lens assembly 26 to form an ion beam 34. In this embodiment this ion beam 34 is steered and shaped through the ion implanter 10 such that the ion beam 34 passes through a mass analysis stage 30. Ions of a desired mass are selected to pass through a mass resolving slit 32 and then conveyed onward along an ion beam path 34 towards the semiconductor wafer 12. Before reaching the semiconductor wafer 12, the ions are decelerated by deceleration lens assembly 48 and pass through a plasma flood system 49 that acts to neutralise the ion beam 34.

Ions formed within the ion source 14 are extracted through an exit aperture 28 using a negatively-biased (relative to ground) extraction electrode 26. A potential difference is created between the ion source 14 and the following mass analysis stage 30 by a power supply 21 such that the extracted ions are accelerated. The ion source 14 and mass analysis stage 30 are electrically isolated from each other by an insulator (not shown).

The mixture of extracted ions are then passed through the mass analysis stage 30 so that the mixture passes around a curved path through a flight tube 46 under the influence of a magnetic field. The radius of curvature travelled by any ion is determined by its mass, charge state and energy. The magnetic field is controlled so that, for a set beam energy, only those ions with a desired mass-to-charge ratio energy exit along a path coincident with the mass resolving slit 32.

The ion beam 34 is then transported to the target, i.e. the substrate wafer 12 to be implanted or a beamstop 38 when there is no wafer 12 in the target position. Before arriving at the wafer 12 or beamstop 38, the ions are decelerated using a deceleration lens assembly 48 positioned between the mass analysis stage 30 and upstream of the wafer 12. The deceleration lens assembly 48 is followed by a plasma flood system 49 that operates to produce a flood of electrons that are available to the semiconductor wafer 12 to neutralise the effect of the incident positive ions.

The semiconductor wafer 12 is mounted on a wafer holder 36, wafers 12 being successively transferred to and from the wafer holder 36 for serial implantation. Alternatively, parallel processing may be used where many wafers 12 are positioned on a carousel 36 that rotates to present the wafers 12 to the incident ion beam 34 in turn.

A controller is shown at 50 that comprises a suitably programmed computer. The controller 50 is provided with software for managing operation of the ion implanter 10.

Figure 2:
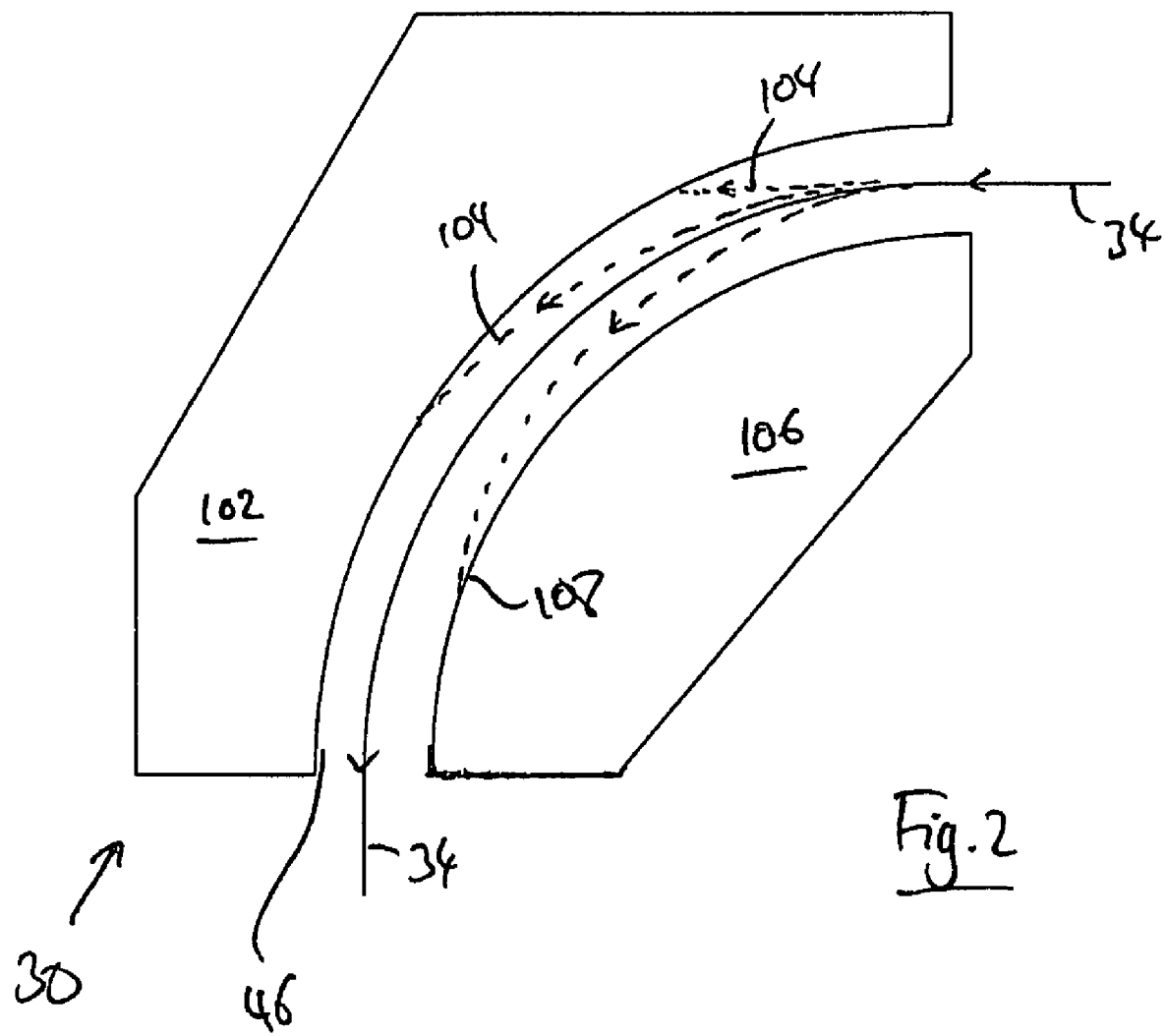
FIG. 2 is a schematic representation of a flight tube of the ion implanter of FIG. 1.

FIG. 2 shows a representation of the mass analyser 30 of FIG. 1, along with the path 34 of ions through a flight tube 46 defined by the mass analyser 30. The solid line 34 shows the path of ions having the desired mass-to-charge ratio and describes a smooth quarter-turn through the mass analyser 30. Ions having a greater mass-to-charge ratio may strike an outer part 102 of the mass analyser 30, as shown at 104. Conversely, ions having a lesser mass-to-charge ratio will turn inwardly and may strike an inner part 106 of the mass analyser 30, as shown at 108.

Ions that strike the mass analyser 30 in these ways may sputter material from those parts 102, 106. Typically, these parts 102, 106 will be made from graphite and so there is a danger that graphite will become entrained in the ion beam as it passes through the mass analyser 30.

Figure 3:
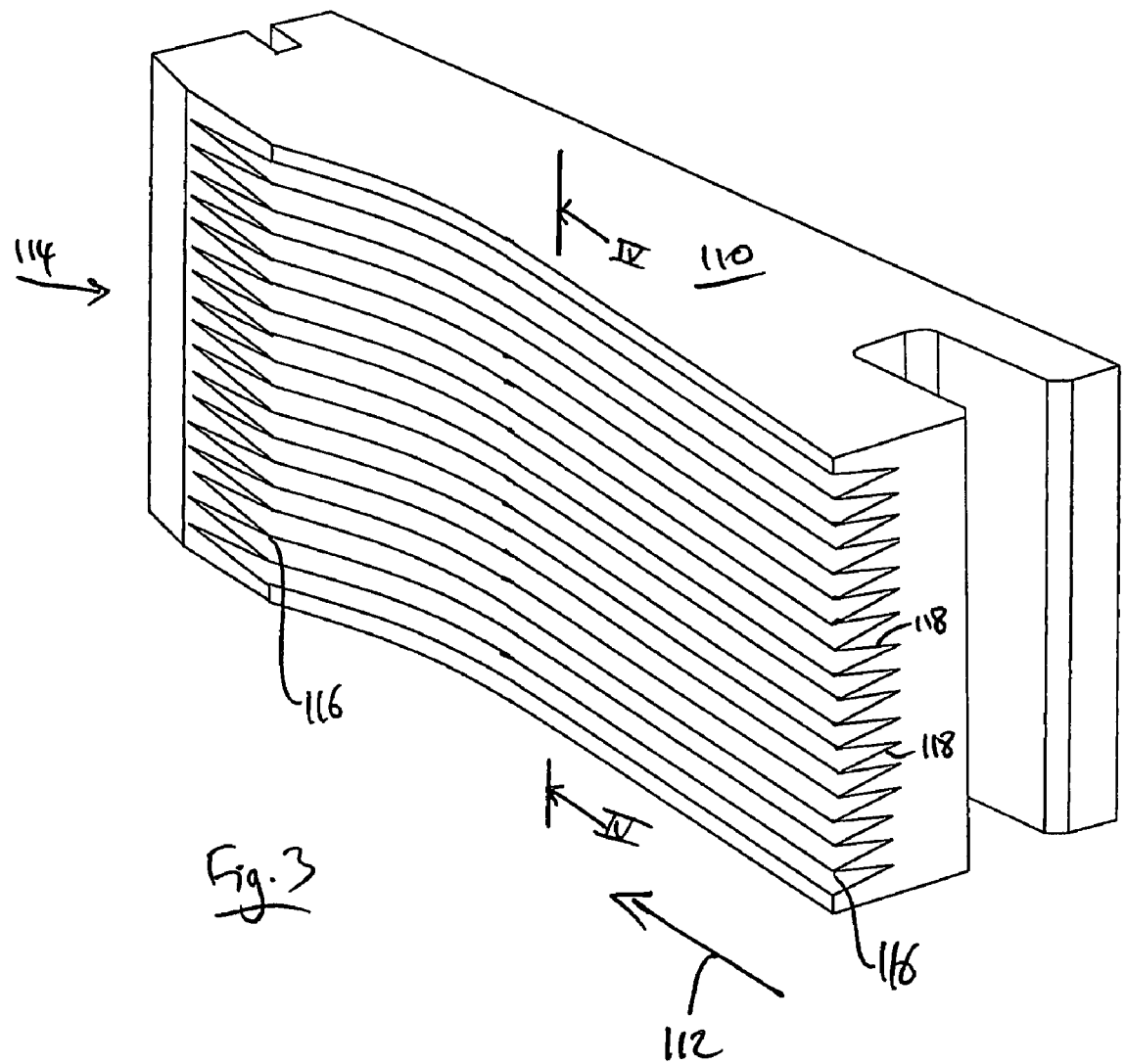
FIG. 3 shows a part that may be used in the flight tube of FIGS. 2 or 5.

The surfaces of the mass analyser 30 adjacent the ion beam's path 34 may be shaped as shown in FIG. 3 so as to minimise the risk of sputtered material becoming entrained in the ion beam. The direction of ion travel past the component 110 of FIG. 3 is shown by the arrow 112. As can be seen, rather than the component 110 presenting an upright face to the ion beam as is the case with prior art mass analysers, the component 110 has a surface 114 that is shaped to form a series of ridges 116. The ridges 46 are separated by angled faces 118. Hence, ions striking such a component 110 will strike the angled faces 118. These angled faces 118 will act to provide a tendency for any sputtered material to be ejected away from the ion beam. As a result, it is less likely that any sputtered material will become entrained in the ion beam.

The shaping may be used on both the outer and inner parts 102, 106 of a mass analyser 30, and may be used only in the region adjacent to the ion beam's path 34.

Figure 4A:
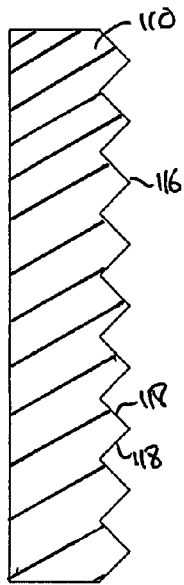
FIGS. 4a to 4h show cross sections of the part of FIG. 3 and of other similar parts.

FIG. 4a shows the cross section taken along line IV-IV of FIG. 3. As can be seen, the angled faces 118 form a series of ridges 116. The faces 118 are of equal, but opposite angles and of a uniform length, hence giving rise to a series of uniform ridges 116. Other arrangements are possible, and some of these arrangements are shown in FIGS. 4b to 4h.

Figure 4B:
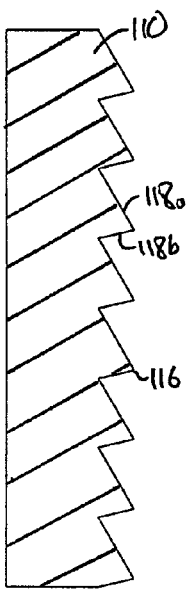
Figure 4C:
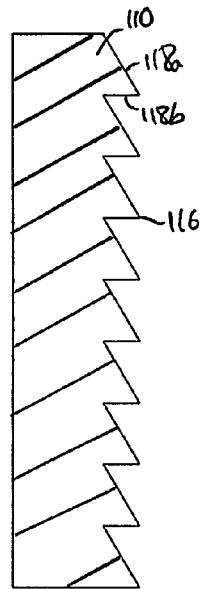
Figure 4D:
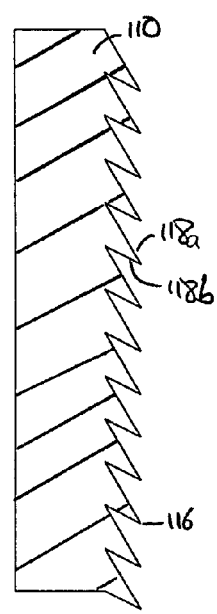

The angles and lengths of the faces 118 of each ridge 116 need not be the same. FIG. 4b shows an embodiment where faces 118a and 118b no longer correspond: for each ridge 116, face 118a is longer and shallower, whereas face 118b is shorter and steeper. Such an arrangement would bias particle ejection in an upward direction. FIG. 4c is similar to FIG. 4b, but now the shorter faces 118b are upright. FIG. 4d shows an embodiment where both faces 118a and 118b are angled in the same sense, thereby forming downwardly projecting ridges 116. Faces 118b do not have line of sight to the ion beam.

Figure 4E:
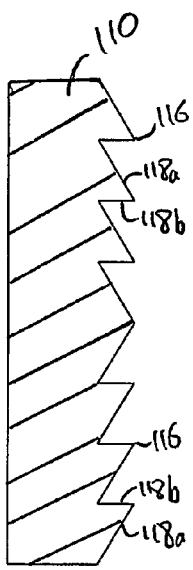

Not all ridges 116 need be the same. FIG. 4e shows an embodiment akin to FIG. 4c that has upright faces 118b, but where the arrangement is mirrored about a centre line. Thus, the upper half of the component 110 will bias ejection of particles upwardly, whereas the lower half will bias ejection downwardly. This is particularly advantageous when the centre line is placed at the same plane as the ion beam as it promotes particle ejection away from the plane of the ion beam.

Figure 4F:
Figure 4G:
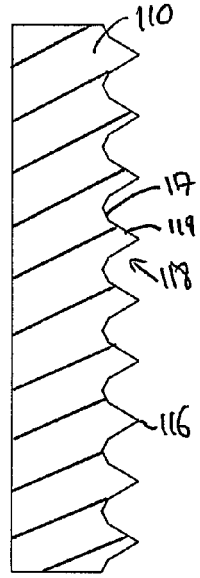

Each face. 118 may comprise two or more "sub-faces". Such arrangements are shown in FIGS. 4f and 4g. Each ridge 116 comprises faces 118 that comprise two sub-faces 117 and 119. The shallower sub-face 119 appears at the base of the ridges 116 in FIG. 4g and at the top of the ridges 116 in FIG. 4f.

Figure 4H:
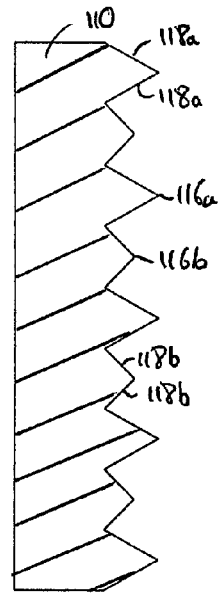

Not all ridges 116 need have the same height, and such an arrangement is shown in FIG. 4h. Here, the series of ridges 116 alternates between short ridges 116b and tall ridges 116a.

Of course, arrangements are possible that combine different concepts illustrated in FIGS. 4a to 4h, for example the mirror symmetry of FIG. 4e and the sub-faces of FIGS. 4f or 4g.

Figure 5:
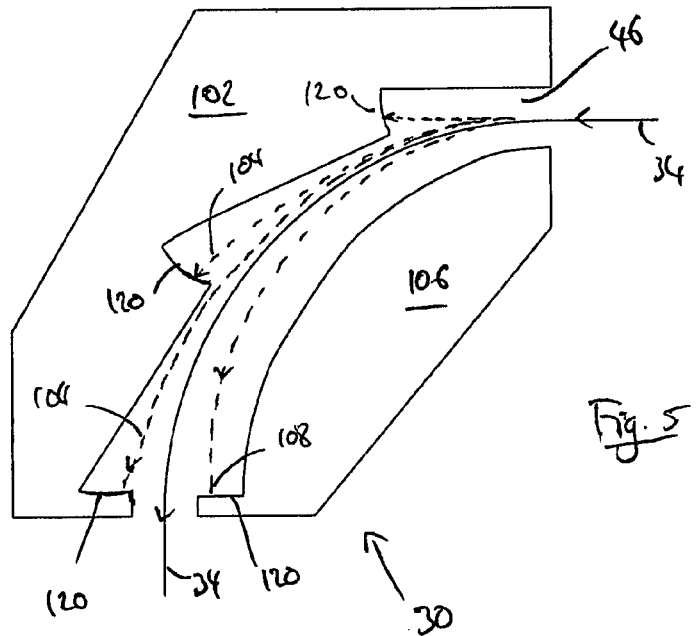
FIG. 5 is a schematic representation of a further flight tube.

FIG. 5 shows an alternative arrangement for the mass analyser 30. In this arrangement, the outer and inner parts 102, 106 are shaped so as to present surfaces 120 that are more likely to be struck substantially normally by ions not having the desired mass-to-charge ratio. This is advantageous because the chances of sputtering material are greatly reduced if the ions strike a surface at right angles, rather than striking a glancing blow. Accordingly, the outer part 102 is formed with three cutaway sections that each present a surface 120 that faces the incoming ion beam, as shown. The inner part 106 is shaped to have a decreasing radius of curvature, thereby providing surface 120 towards the exit of the mass analyser 30. The ribbed construction of FIG. 3 may be used with such an arrangement, for example by shaping the parts of the surfaces adjacent the ion beam's path 34 with these ribs 116.

The above ribbed surfaces tackle the problem of sputtered material becoming entrained in the ion beam by providing angled surfaces 118 to deflect sputtered material away from the ion beam. Another approach to reduce the problem of contamination is to reduce the amount of sputtered material that is generated in the first place. To this end, graphite parts 102, 106 such as those shown in FIGS. 2 and 5 may be treated so as to provide a coating of another material. Ideal candidates are tungsten and tantalum carbide. Providing such parts 102, 106 with a thin coating of one such material has been found to reduce particle and flake formation and has also been seen to extend the life of the graphite part. The tungsten or tantalum carbide coating can be applied to the graphite part using chemical vapour deposition, sputtering or plasma spraying. Other methods of coating will be apparent to the person skilled in the art.

As will be appreciated by the person skilled in the art, variations may be made to the above embodiment without departing from the scope of the invention defined by the claims.

The above embodiment is described in the context of a mass analyser 30. However, the idea of using ribbed surfaces 14 adjacent the ion beam may be employed on other components within the ion implanter 10. For example, the idea may be employed on electrodes that may even face the ion beam 34. Examples are shown in FIGS. 6a-c and FIGS. 7a-d.

In FIGS. 6a and 6b, an ion implanter component 110 corresponds to an electrode (e.g. an electrode of the deceleration lens assembly). The electrode 110 is provided with an elongate aperture 130 through which the ion beam 34 passes. Beam blow up or beam misalignment may cause the ion beam 34 to clip the electrode 110. Ribbing the upstream surface of the electrode 110 mitigates the problem of entrainment of any particles sputtered from the electrode 110 because of beam strike. The ribbing may take any of the forms described above, although FIGS. 6a and 6b illustrate ridges 116 akin to that shown in FIG. 4e. This embodiment is primarily intended for an electrode 110 where the ion beam 34 is asymmetric or where the aperture 130 is used to define (clip or focus) the ion beam predominantly in one direction. For example, the electrode 110 may be used to define the small dimension of a ribbon beam or as a mass-resolving aperture such that the small dimension is the mass-resolving focal point.

As a result of clipping being predominantly in one direction only, the ridges 116 run vertically only. Two ridges 116 are shown to either side of the aperture 130, although other numbers may be used.

In addition, the walls 150 that define the aperture 130 may also be angled, as best seen in FIG. 6c. In this example, the walls 150 are angled to provide an aperture 130 that tapers outwardly, thereby minimising beam strike of the diverging ion beam 34 as it passes through the aperture 130. The idea of providing ribs on the upstream surface may be used independently of angling the walls 150. Also, not all of the walls 450 need be angled. For example, if a slot aperture is used, it may be preferred only to provide angled walls on the long sides of the aperture 130 and so have normal walls on the short sides.

A second example of an electrode 110 is shown in FIGS. 7a-d. In this example, aperture 130 is squarer and so more suitable for use with ion beams 34 that are likely to clip on any side of the aperture 130. As a result, ridges 116 are provided in both the horizontal and vertical directions. Having a single horizontal ridge on either side of the aperture 130 and two vertical ridges 116 on either side of the aperture 130 is merely an example, and these numbers may be varied. Although FIGS. 7c-d show oblique side walls 160 of the apertures, angled sides 160 akin to those illustrated in FIG. 6c may be used.

In addition, the method of the present invention may be used with components made of different materials, and not just graphite which is seen as a particularly beneficial material. As a result, metal parts may also be provided with ribs in this way.

Where used on downstream components, there is a greater likelihood of deposition of sputtered material ablated from components upstream in the ion implanter 10. As mentioned previously, our co-pending patent application U.S. Ser. No. 11/651,107 describes a way of mitigating against flake delamination of such deposited material (and the entire contents of U.S. Ser. No. 11/651,107 are incorporated herein by reference). In this application, surfaces are patterned with grooves to prevent flake formation. This technique may be used in conjunction with the present invention in that the surfaces comprising the ridges may be patterned in any of the ways described therein, rather than just being the plain surfaces shown in FIG. 3.

Figure 8:
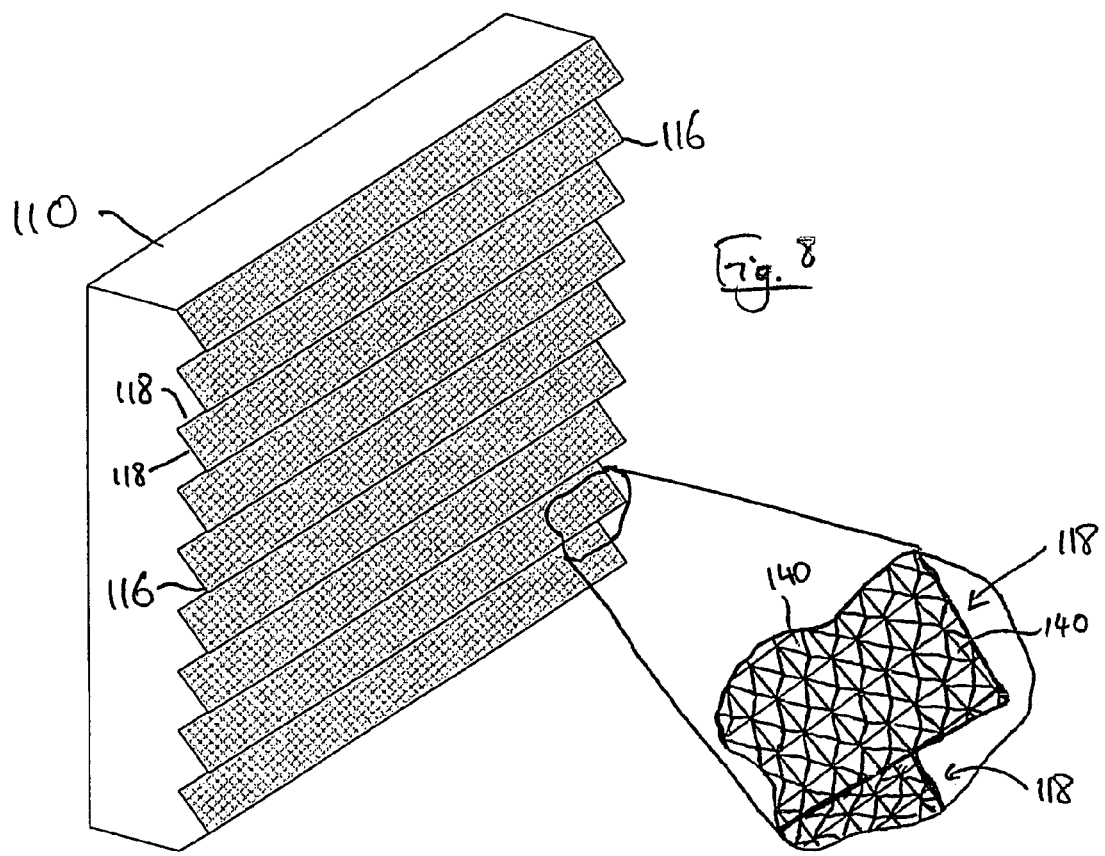
FIG. 8 is a perspective view, including a detail, of a part that may be used in a flight tube showing roughening of the surfaces that form a series of ridges.

FIG. 8 shows a component 110 provided with ridges 116 akin to that FIG. 4a. However, the faces 118 of the ridges 116 are provided with a series of tetrahedra, as best seen in the detail in the lower right of FIG. 8. These tetrahedra are formed by patterning the faces 118 with two series of grooves that intersect at right angles. The relative size of the series of ridges 116 when compared to the tetrahedra 140 means that the macroscopic property of the angled faces causing material to be sputtered away from the ion beam 34 is preserved. Yet, the relatively microscopic tetrahedra assist in preventing delamination of larger flakes of material.

The invention claimed is:

1. An ion implanter component having a surface that defines, at least in part an ion beam path through an ion implanter, wherein at least a portion of the surface is shaped so as to present a series of angled faces and upright faces that meet at sharp intersections, thereby forming a substantially saw tooth cross section, and wherein the angled faces above a center plane are arranged to face upwardly and away from the ion beam path passing the surface, and the angled faces below the center plane are angled to face downwardly and away from the ion beam path.

2. The component of claim 1, wherein the component defines the ion beam path therethrough and wherein portions of all surfaces immediately adjacent the ion beam path are shaped so as to present a series of angled faces that meet at sharp intersections, thereby forming a substantially saw tooth cross section, such that the angled faces are arranged to face away from the ion beam path through the component.

3. The component of claim 1, wherein the angled faces comprise a series of grooves.

4. The component of claim 3, wherein the grooves extend generally in the direction of the ion beam path through the component.

5. The component of claim 3, wherein the grooves have a width selected from the group of: 10 mm to 100 mm, 10 mm to 50 mm, and 10 mm to 25 mm.

6. The component of claim 1, wherein the component is formed of graphite.

7. The component of claim 6, comprising a surface coating having a greater resistance to sputtering than graphite.

8. The component of claim 7, wherein the coating is tungsten or tantalum carbide.

9. The component of claim 1, wherein one or more of the faces has been roughened to provide a pattern of surface features.

10. The component of claim 9, wherein the surface features comprises an array of tetrahedra.

11. The component of claim 1, wherein the component is a flight tube.

12. The component of claim 1, wherein the component is an element defining a beamline aperture.

13. A mass analyzer for an ion implanter comprising one or more parts having a surface that define a flight tube for a path of a beam of ions passing through the mass analyzer, wherein at least a part of the surface defining the flight tube is shaped so as to present a series of faces that are angled away from the ion beam path, and wherein the series of faces meet at sharp intersections, thereby forming a substantially saw tooth cross section, the angled faces above a center plane of the surface being angled to face upwardly and away from the ion beam path, and the angled faces below the center plane being angled to face downwardly and away from the ion beam path.

14. The mass analyzer of claim 13, wherein the series of faces form a series of grooves extending generally in the direction of the ion beam path.

15. The mass analyzer of claim 14, wherein the grooves have a width selected from the group of: 10 mm to 100 mm, 10 mm to 50 mm, and 10 mm to 25 mm.

16. The mass analyzer of claim 14, wherein the one or more parts are formed of graphite and comprise a surface coating having a greater resistance to sputtering than graphite.

17. The mass analyzer of claim 16, wherein the coating is tungsten or tantalum carbide.

18. The mass analyzer of claim 17, wherein the surface having the surface patterning is oriented to face up the flight tube in an upstream direction.

* * * * *